United States Patent [19]

Iwasaki

[11] Patent Number: 5,703,527
[45] Date of Patent: Dec. 30, 1997

[54] FREQUENCY MODULATED SIGNAL DEMODULATOR CIRCUIT AND COMMUNICATION TERMINAL EQUIPMENT

[75] Inventor: Jun Iwasaki, Tokyo, Japan

[73] Assignee: Sony Corporation, Tokyo, Japan

[21] Appl. No.: 627,581

[22] Filed: Apr. 4, 1996

[30] Foreign Application Priority Data

Apr. 13, 1995 [JP] Japan .................... 7-112540

[51] Int. Cl.$^6$ .................................... H03D 3/00
[52] U.S. Cl. .................... 329/336; 329/341; 329/343; 375/324; 455/214
[58] Field of Search .................... 329/315, 318, 329/323, 327, 336, 341, 343, 300, 302, 303; 375/324; 455/214

[56] References Cited

U.S. PATENT DOCUMENTS

| | | | |
|---|---|---|---|
| 4,090,145 | 5/1978 | Webb | 329/323 |
| 4,755,761 | 7/1988 | Ray, Jr. | 329/323 |
| 5,048,058 | 9/1991 | Kaleh | 329/300 |
| 5,197,085 | 3/1993 | Luff et al. | 329/302 |

*Primary Examiner*—Siegfried H. Grimm
*Attorney, Agent, or Firm*—Jay H. Maioli

[57] ABSTRACT

A frequency modulated signal demodulator circuit wherein an in-phase component (I) and an orthogonal component (Q) of a frequency modulated signal output from an orthogonal detector circuit are respectively delayed by one sampling time. The result (I·Qs) of multiplying the in-phase component (I) by a delayed orthogonal component (Qs) is subtracted from the result (Q·Is) of multiplying the orthogonal component (Q) by the delayed in-phase component (Is), and the subtraction result (dθ) is multiplied by an inverse (1/Ts) of the sampling time to derive an instantaneous angular frequency (dθ/Ts), whereby the frequency modulated signal can be demodulated without any feedback loop which is required by conventional FM demodulator circuits, thus making it possible to avoid a deterioration demodulation characteristics due to the influence of phasing.

20 Claims, 7 Drawing Sheets

FREQUENCY MODULATED SIGNAL DEMODULATOR CIRCUIT AND COMMUNICATION TERMINAL EQUIPMENT

BACKGROUND OF THE INVENTION

1. Field of the Invention

The present invention relates to a frequency modulated signal demodulator circuit and communication terminal equipment which are suitable for use, for example, in a digital cellular telephone.

2. Description of the Related Art

In recent years, the digital technologies have been remarkably progressed. This also applies to the communications field, wherein digital communications have been increasingly brought into practical use in a variety of applications. Mobile communications, which is increasingly demanded these days, are not exceptional, and it is thought that communications terminal apparatuses of the digital communications type will dominate the mobile communications of the next generation. However, in the current mobile communications, analog frequency modulation (FM) schemes have been widely employed as the communications scheme, so that a certain length of time will be necessary to completely replace the currently prevailing analog schemes with digital schemes. For this reason, it is thought that for the time being, communications terminal apparatuses of dual mode type supporting both analog schemes and digital schemes will be essential to the mobile communications.

Incidentally, for demodulating FM signals, it is a general tendency to frequency convert received waves to an intermediate frequency signal and demodulate it by using a cheap analog device, for example, an orthogonal detector or the like. This FM demodulation method is also employed in dual mode communications terminal apparatuses. Since the dual mode communications terminal apparatus requires a device for demodulating digital signals as well as a device for demodulating FM signals, the scale of circuits built in the apparatus is increased, thus resulting in a larger size of the apparatus itself.

To solve the above problem, it is thought to demodulate FM signals by digital processing such that both digital signals and FM signals are digitally demodulated in a single device.

One of methods for digitally demodulating FM signals is the employment of a phase-locked loop (PLL) configuration. An FM demodulator circuit employing this PLL configuration will be explained below with reference to FIG. 1.

A conventional communication terminal equipment is provided with a receiver 1, as illustrated in FIG. 1, which is adapted to receive FM signals by an antenna 2. An FM signal S1 received by the antenna 2 is inputted to and amplified by a low noise amplifier 3. Then, the amplified signal from the low noise amplifier 3 is passed through a band-pass filter 4 for bandwidth limitation and inputted to an orthogonal detector circuit 5. In the orthogonal detector circuit 5 the inputted FM signal S1 is supplied to mixers 6 and 7.

An oscillator 8 in the orthogonal detector circuit 5 is a device for generating an oscillating signal S2 at a radio frequency (RF frequency). The oscillating signal S2 generated by the oscillator 8 is supplied to the mixer 6 and the phase shifter 9 which shifts the phase of the supplied oscillating signal by $\pi/2$ and supplies the phase shifted oscillating signal to the mixer 7.

The mixer 6 multiplies the supplied FM signal S1 by the oscillating signal S2 to generate an in-phase component of the base-band converted FM signal S1. The generated in-phase component is outputted to an analog-to-digital (A/D) convertor 10. The mixer 7, on the other hand, multiplies the supplied FM signal S1 by the oscillating signal S2 having its phase shifted by $\pi/2$ to generate an orthogonal component of the base-band converted FM signal S1, and outputs the thus generated orthogonal component to an analog-to-digital (A/D) convertor 11.

Subsequently, the A/D convertors 10, 11 sample the in-phase component and the orthogonal component at a predetermined sampling time, respectively, to digital-to-analog convert the in-phase and the orthogonal components, thereby generating digital in-phase component I and orthogonal component Q. The in-phase component I and the orthogonal component Q are both supplied to an FM demodulator circuit 12 which employs a PLL configuration.

The FM demodulator circuit 12 is composed of automatic gain control (AGC) circuits 13, 14; a phase comparator circuit 15; a loop filter 16, a Numerical Control Oscillator (NCO) circuit 17; and a band-pass filter 18.

The FM demodulator circuit 12 employing the PLL configuration detects the phase of an oscillating signal generated by the NCO circuit 17 and the phase of an input FM signal, using the phase comparator circuit 15, and forms a feedback loop based on the detection results to control the NCO circuit 17, such that the frequency and the phase of the oscillating signal from the NCO 17 are constantly coincident with those of the inputted FM signal. Therefore, in a synchronized state, the oscillating frequency of the oscillating signal generated by the NCO circuit 17 follows the frequency of the input FM signal, so that these two signals present completely the same changes. Thus, a control voltage of the NCO circuit 17, that is, an output signal of the loop filter 16, is a signal responsive to FM demodulation results. Therefore, the output signal of the loop filter 16 is passed through the band-pass filter 18 to extract only necessary band components, thus generating a demodulated signal S2 which constitutes the final FM demodulation results.

It should be noted that the FM demodulator circuit 12 uses the AGC circuits 13, 14 because the input signals (that is, the in-phase component I and the orthogonal component Q) would present deteriorated characteristics unless they were passed through the AGC circuits 13, 14 to be subjected to amplitude control.

As will be understood from the foregoing explanation, the most important component of the FM demodulator circuit 12 is the phase comparator circuit 15 which will be described below in detail.

With a phase component represented by $\theta$, when a base-band converted FM signal is expressed in a complex number, a current signal is given by the following equation:

$$\text{current: } \exp(j\theta) \quad (1)$$

A signal of a time $\tau$ before is given by the following equation:

$$\tau \text{ time before: } \exp(j(\theta - \theta\tau)) \quad (2)$$

When the current signal given by Equation (1) is multiplied by a conjugate of the signal of the time $\tau$ before, the following equation is derived:

$$\exp(j\theta) \times \exp(-j(\theta - \theta\tau)) = \exp(\theta\tau) = \cos(\theta\tau) + j\sin(\theta\tau) \quad (3)$$

In Equation (3), assuming that $\theta\tau$ is sufficiently small, an approximation given by the following equation can be applied:

$$\sin\theta\tau \approx \theta\tau \quad (4)$$

Thus, Equation (3) can be transformed as given by the following equation:

$$\cos(\theta\tau)+j\sin(\theta\tau) \approx \cos(\theta\tau)+j\theta\tau \quad (5)$$

In other words, the imaginary part of the result derived by calculating Equation (3) shows $\theta\tau$.

While the FM signal relies on a frequency displacement to express data, the demodulation of the FM signal is achieved if a phase component $\theta\tau$ can be derived. This is because a differentiation of the phase component is an instantaneous angular frequency, and if the instantaneous angular frequency is derived, it means that a frequency displacement is derived. Thus, by calculating Equation (3), an FM signal can be demodulated.

Next, how to implement this method by an actual circuit configuration will be described below. A real part and a imaginary part of a base-band converted FM signal as expressed by the foregoing Equation (1) correspond to an in-phase component I and an orthogonal component Q outputted from the orthogonal detector circuit 5, so that the input FM signal is given by the following equation:

$$\text{FM signal: } I+jQ \quad (6)$$

Also, a phase component of the FM signal of a time $\tau$ before is expressed by the following equation:

$$\text{phase component }\tau\text{ time before: }\cos\theta+j\sin\theta \quad (7)$$

Here, a calculation corresponding to the foregoing Equation (3) (specifically, Equation (6) is multiplied by a conjugate of Equation (7)), results in the following equation:

$$(I+jQ)\times(\cos\theta-j\sin\theta)=(I\cos\theta+Q\sin\theta)+j(Q\cos\theta-I\sin\theta) \quad (8)$$

As can be seen from this Equation (8), by calculating an equation shown in the imaginary part, i.e., the following equation:

$$\text{imaginary part: }Q\cos\theta-I\sin\theta \quad (9)$$

the above-mentioned phase component $\theta\tau$ is calculated.

The phase comparator circuit 15 illustrated in FIG. 1 implements Equation (9), wherein the in-phase component I and the orthogonal component Q outputted respectively from the AGC circuits 13, 14 are supplied to multipliers 15A, 15B, respectively. The multiplier 15A multiplies a sine value outputted from a ROM (Read Only Memory) 15C by the in-phase component I supplied thereto, and outputs the multiplication result to a subtracter 15D. The multiplier 15B, in turn, multiplies a cosine value outputted from the ROM 15C with by the orthogonal component Q supplied thereto, and outputs the multiplication result to a subtracter 15D. Subsequently, the subtracter 15D subtracts the multiplication result of the multiplier 15A from the multiplication result of the multiplier 15B to complete the calculation given by Equation (9), thereby deriving the phase component $\theta\tau$. It should be noted that sine values and cosine values have previously been stored in the ROM 15C such that the ROM 15C outputs a sine value and a cosine value in accordance with an oscillating signal supplied from the NCO circuit 17.

Although the FM demodulator circuit 12 employing the PLL configuration as mentioned above exhibits quite favorable demodulation characteristic, for example, in a white noise environment (so-called static characteristic), it has a problem that its demodulation characteristic is significantly deteriorated in environments in which phasing or the like occur (so-called dynamic characteristic). It should be noted that the phasing, as mentioned herein, is a phenomenon where received waves are affected by reflection, diffraction, dispersion, or the like due to the topography and objects on the ground near a mobile station to be transformed into multiple-waves, and the multiple-waves interfere with each other to cause random fluctuations of the signal intensity of the received waves.

The dynamic characteristic is deteriorated because the FM demodulator circuit 12 employing the PLL configuration has a feedback loop. More specifically, if the phasing or the like causes the signal intensity to randomly drop, the phase locked by the PLL is released. For the phase to be again locked, an input signal, which is normal to a certain degree, is required. In addition, since a relatively long time is required to lock the phase, the demodulation of data is consequently prevented during this time. For this reason, the FM demodulator circuit employing the PLL configuration may suffer from the deterioration of its dynamic characteristic.

SUMMARY OF THE INVENTION

In view of the foregoing, an object of the present invention is to provide a frequency modulated signal demodulator circuit capable of improving the demodulation characteristics, as compared with the prior art, in a simple configuration.

Another object of the present invention is to provide a communication terminal equipment using the frequency modulated signal demodulator circuit.

The nature, principle and utility of the invention will become more apparent from the following detailed description when read in conjunction with the accompanying drawings in which like parts are designated by like reference numerals or characters.

DETAILED DESCRIPTION OF THE EMBODIMENT

Figure 1:
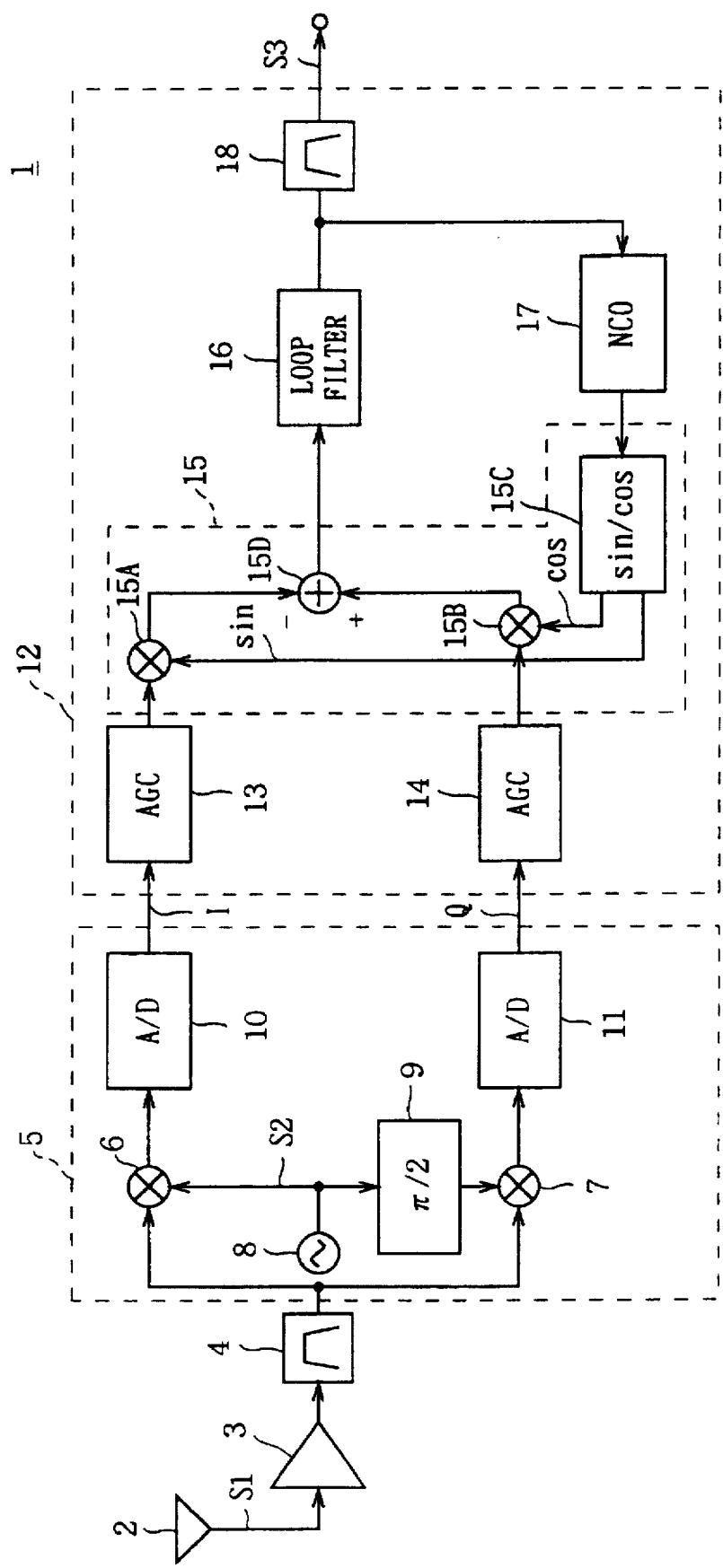
FIG. 1 is a block diagram illustrating a conventional FM demodulator circuit using a PLL configuration and peripheral circuits associated therewith.

Preferred embodiments of the present invention will be described with reference to the accompanying drawings:
(1) First Embodiment Referring first to FIG. 2, in which parts corresponding to those in FIG. 1 are designated by the same reference numerals, an FM demodulator circuit, generally designated by 20, receives at input terminals $IN_1$, $IN_2$ thereof an in-phase component I and an orthogonal component Q outputted from an orthogonal detector circuit 5 (see FIG. 1) located at a previous stage.

The in-phase component I inputted to the input terminal $IN_1$ is supplied to a delay-type flip-flop 21 (hereinafter abbreviated as "D-FF") serving as a delay circuit as well as to a multiplier 22. The D-FF 21 delays the supplied in-phase component I, for example, by one sampling time Ts, and outputs the delayed in-phase component Is to a multiplier 23. It should be noted that the sampling time Ts is the sampling of analog-to-digital (A/D) convertors 10, 11 arranged in the orthogonal detector circuit 5 located at the previous stage.

In this event, by delaying the in-phase component I by one sampling time Ts, the delayed in-phase component Is supplied to the multiplier 23 is equal to data one sample before the in-phase component I supplied to the multiplier 22.

The orthogonal component Q inputted to the input terminal $IN_2$ is supplied to a D-FF 24 serving as a delay circuit as well as to the multiplier 23. The D-FF 24 delays the supplied orthogonal component Q, for example, by one sampling time Ts, and outputs the delayed orthogonal component Qs to the multiplier 22, similarly to the D-FF 21. Also in this event, by delaying the orthogonal component Q by one sampling time Ts, the delayed orthogonal component Qs supplied to the multiplier 22 is equal to data one sample before the orthogonal component Q supplied to the multiplier 23.

The multiplier 22 multiplies the in-phase component I by the orthogonal component Qs, and outputs the multiplication result (I·Qs) to a subtracter 25. The multiplier 23, in turn, multiplies the orthogonal component Q by the in-phase component Is, both supplied thereto, and outputs the multiplication result (Q·Is) to the subtracter 25. The subtracter 25 subtracts the multiplication result (I·Qs) from the multiplication result (Q·Is) and outputs the resulting phase difference dθ (=Q·Is–I·Qs) to a multiplier 26.

A storage element 27 is composed of, for example, a memory and stores an inverse of the sampling time (1/Ts). This inverse of the sampling time (1/Ts) is read from the storage element 27 and supplied to the multiplier 26.

The multiplier 26 multiplies the phase difference dθ by the inverse of the sampling time (1/Ts) and outputs the multiplication result (dθ/Ts) to a band-pass filter 18. Stated another way, the multiplier 26 derives a value resulting from a division of the phase difference dθ by the sampling time Ts.

The band-pass filter 18 limits the bandwidth of the supplied multiplication result (dθ/Ts), and outputs the bandwidth-limited multiplication result to an output terminal OUT. In this way, a demodulated signal S3, resulting from the demodulation of the input FM signal is delivered at the output terminal OUT.

Here, the principle of how the demodulated signal S3 is generated by the configuration described above will be explained below. First, an input FM signal is separated into an in-phase component I and an orthogonal component Q as given by the following equation:

$$\text{FM signal: } I+jQ \tag{10}$$

A phase component of a time Ts before is expressed by an in-phase component Is and an orthogonal component Qs of one sample before, as given by the following equation:

$$\text{phase component Ts time before: } Is+jQs \tag{11}$$

When the FM signal given by Equation (10) is multiplied by a conjugate of the phase component of the FM signal of the time Ts before given by Equation (11), the following equation is derived:

$$(I+jQ)\times(Is-jQs)=(I\cdot Is+Q\cdot Qs)+j(Q\cdot Is-I\cdot Qs) \tag{12}$$

An imaginary part shown in Equation (12), that is the following equation:

$$\text{imaginary part: } Q\cdot Is-I\cdot Qs \tag{13}$$

represents a phase angle displacement dθ, as described in the explanation of the operation of the phase comparator circuit 15 arranged in the FM demodulator circuit 12 employing the PLL configuration with reference to FIG. 1.

In the FM demodulator circuit 20, a phase difference calculation section including the D-FF 21, 24, multipliers 22, 23 and subtracter 25 is a circuit portion which implements Equation (13) for calculating the phase angle displacement dθ. Actually, the phase difference dθ outputted from the subtracter 25 is exactly expressed by Equation (13).

dθ/Ts, derived by multiplying the phase difference dθ by the inverse of the sampling time (1/Ts), indicates a ratio of temporal changes of the phase. Assuming herein that the sampling time Ts is sufficiently small, dθ/Ts represents the phase change differentiated by time, that is, an instantaneous angular frequency. Thus, if dθ/Ts representing the instantaneous angular frequency is passed through the band-pass filter 18 for bandwidth limitation to extract only necessary signal components, a demodulated signal S3, which is the result of demodulating the input FM signal is generated. This is because the instantaneous angular frequency is a frequency displacement itself which represents data.

In the configuration of the FM demodulator circuit 20 described above, an in-phase component I and an orthogonal component Q supplied from the orthogonal detector circuit 5 are inputted to the D-FF's 21, 24, respectively, wherein they are delayed by one sampling time Ts to generate an in-phase component Is and an orthogonal component Qs of one sample before. Then, in the FM demodulator circuit 20, based on the thus generated in-phase component Is and orthogonal component Qs of one sample before as well as the current in-phase component I and orthogonal component Q, a phase difference dθ (=Q·Is–I·Qs) is derived by the multipliers 22, 23 and the subtracter 25. The phase difference dθ is next divided by the sampling time Ts to derive an instantaneous angular frequency (dθ/Ts). Subsequently, in the FM demodulator circuit 20, the derived instantaneous angular frequency (dθ/Ts) is subjected to bandwidth limitation to generate a demodulated signal S3 which is the result of demodulating the input FM signal.

As described above, in the FM demodulator circuit 20, based on an in-phase component I and an orthogonal component Q of an FM signal digitized by the sampling time Ts, the phase difference dθ is derived between a current phase rotation angle and a phase rotation angle of one sample before. Then, by differentiating the phase difference dθ to derive an instantaneous angular frequency (dθ/Ts), the demodulation is carried out. It will be understood that the FM demodulator circuit 20 can demodulate the FM signal without any feedback loop which is required by the conventional FM demodulator circuit 12 employing a PLL configuration.

In this way, the FM demodulator circuit 20 can improve the demodulation characteristic in a phasing environment, as compared with the conventional FM demodulator circuit 12 employing a PLL configuration. The improvement of the demodulation characteristic is achieved by the following reason. Since the conventional FM demodulator circuit 12 has a feedback loop, if phasing or the like causes the phase to come off the locked state, a certain time is required to restore the phase locked state and the demodulation is prevented during this time, whereby the demodulation characteristic is deteriorated. In contrast, since the FM demodulator circuit 20 of this embodiment does not have a feedback loop, it is free from such a demodulation prevention time, even if phasing or the like occurs.

In addition, since the FM demodulator circuit 20 does not have a feedback loop, its configuration is much simpler as compared with the prior art.

According to the configuration of the first embodiment described above, a phase difference dθ is calculated from an in-phase component I and an orthogonal component Q of a current FM signal and an in-phase component Is and an orthogonal component Qs of the FM signal of one sample before, and the phase difference dθ is differentiated to derive an instantaneous angular frequency (dθ/Ts), so that the FM signal can be demodulated without the necessity of a feedback loop, thus making it possible to improve the demodulation characteristic of the FM demodulator circuit in a simple configuration, as compared with conventional FM demodulator circuits.

(2) Second Embodiment

Figure 2:
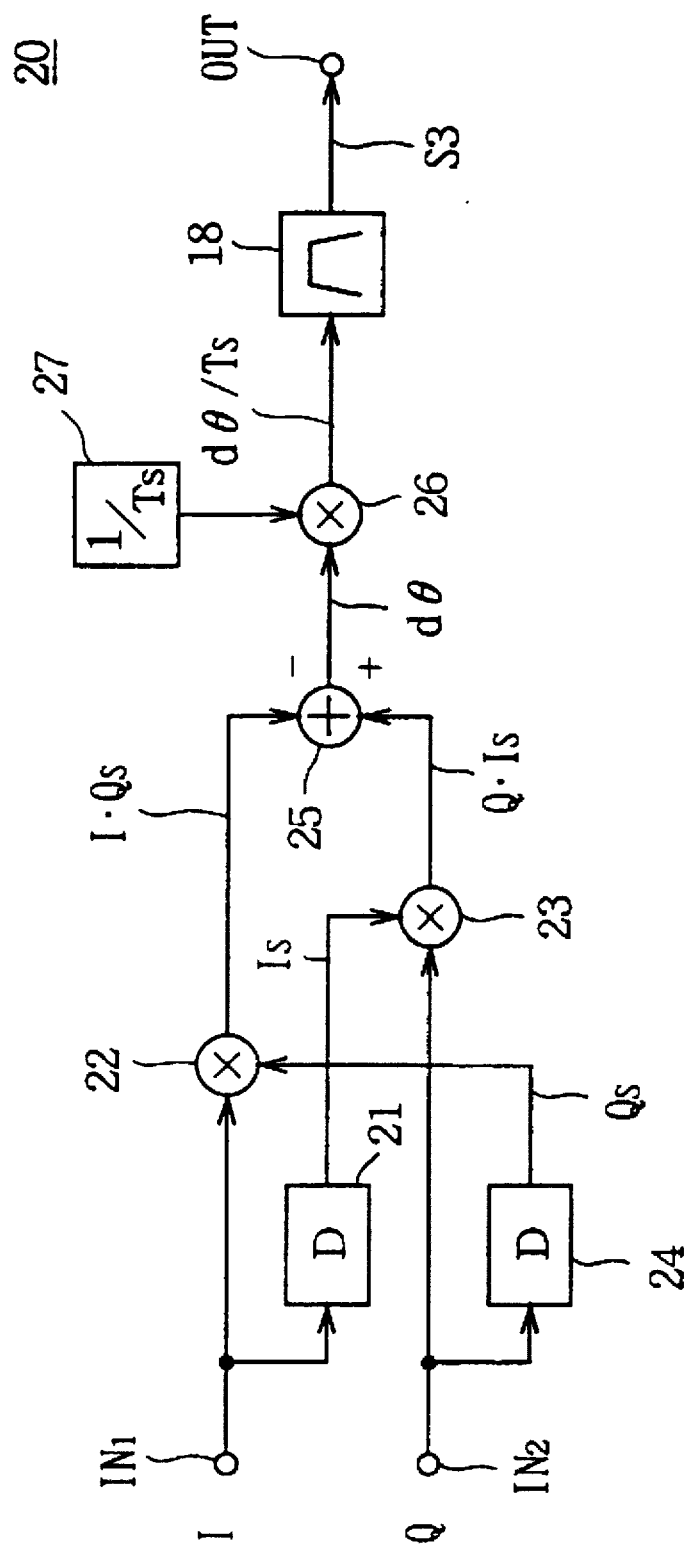
FIG. 2 is a block diagram illustrating the configuration of the FM demodulator circuit according to the first embodiment of the present invention.
Figure 3:
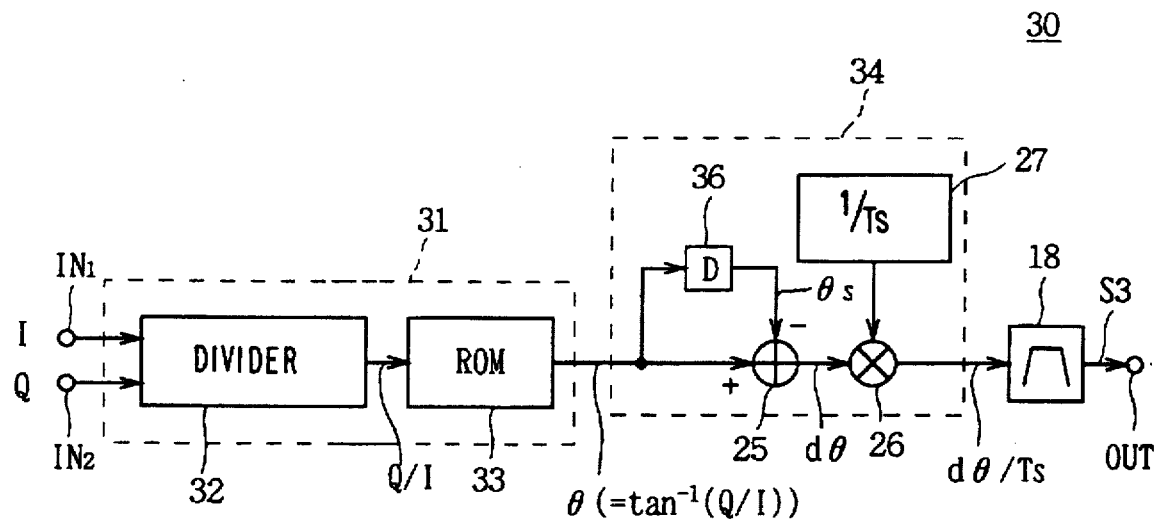
FIG. 3 is a block diagram illustrating the configuration of the FM demodulator circuit according to the second embodiment of the present invention.

Referring next to FIG. 3, in which parts corresponding to those in FIG. 2 are designated the same reference numerals, an FM demodulator circuit according to a second embodiment, is generally designated by reference numeral 30. An in-phase component I and an orthogonal component Q outputted from an orthogonal detector circuit 5 (see FIG. 1) located at a previous stage are supplied to a phase rotation angle detector circuit 31 through input terminals $IN_1$, $IN_2$, respectively.

The phase rotation angle detector circuit 31, as can be supposed by the name, is a circuit for detecting a phase rotation angle θ. Specifically, the phase rotation angle detector circuit 31 calculates the phase rotation angle θ based on the in-phase component I and the orthogonal component Q in accordance with the following equation:

$$\theta = \tan^{-1}(Q/I) \quad (14)$$

Specifically, the phase rotation angle detector circuit 31 first supplies the in-phase component I and the orthogonal component Q to a divider 32 which divides the orthogonal component Q by the in-phase component I, and outputs the division result (Q/I) to a ROM (Read Only Memory) 33 as an address signal.

The ROM 33 stores the values of $\tan^{-1}(Q/I)$ corresponding to the respective values of division results (Q/I) such that a corresponding value of $\tan^{-1}(Q/I)$ can be outputted therefrom when the division result (Q/I) is supplied to the ROM 33 as an address signal. In other words, the ROM 33 forms a ROM table for $\tan^{-1}(Q/I)$.

Thus, in the phase rotation angle detector circuit 31, the divider 32 divides the orthogonal component Q by the in-phase component I to derive the division result (Q/I) which is relied on to read a corresponding value of $\tan^{-1}(Q/I)$ from the ROM 33, thereby providing the phase rotation angle θ. Then, the phase rotation angle detector circuit 31 outputs the derived phase rotation angle θ to a differentiation circuit 34.

The differentiation circuit 34 is provided to differentiate the phase rotation angle θ. The phase rotation angle θ inputted to the differentiation circuit 34 is supplied to a subtracter 25 as well as to a D-FF 36 serving as a delay circuit. The D-FF 36 delays the supplied phase rotation angle θ by one sampling time Ts and outputs the delayed phase rotation angle θs to the subtracter. It should be noted that also in the second embodiment, Ts indicates a sampling time of analog-to-digital (A/D) convertors 10, 11 arranged in the orthogonal detector circuit 5 at a previous stage.

In this event, by delaying the phase rotation angle θ by one sampling time Ts, a phase rotation angle θs is equal to data of one sample before the phase rotation angle θ.

The subtracter 25 subtracts the phase rotation angle θs of one sample before from the current phase rotation angle θ, and outputs the resulting phase difference dθ (=θ−θs).

A storage element 27 stores an inverse of the sampling time (1/Ts), similarly to the first embodiment, such that the inverse value of the sampling time (1/Ts) is read therefrom and outputted to a multiplier 26.

The multiplier 26 multiplies the phase difference dθ by the inverse of the sampling time (1/Ts) and outputs the multiplication result (dθ/Ts) to a band-pass filter 18. In other words, a division of the phase difference dθ by the sampling time Ts is made by the multiplier 26 to differentiate the phase rotation angle θ, that is, to derive the instantaneous angular frequency. Subsequently, the band-pass filter 18 limits the bandwidth of the multiplication result (dθ/Ts) to generate a demodulated signal S3, which is the result of demodulating the FM signal, at an output terminal OUT.

In the configuration of the FM demodulator circuit 30 as described above, an in-phase component I and an orthogonal component Q of an FM signal supplied from the orthogonal detector circuit 5 is inputted to the phase rotation angle detector circuit 31 which divides the orthogonal component Q by the in-phase component I. Then, a value $\tan^{-1}(Q/I)$ corresponding to the quotient is read from the ROM 33 to derive a phase rotation angle θ. Then, in the FM demodulator circuit 30, the derived phase rotation angle θ is supplied to the differentiation circuit 34 which subtracts a phase rotation angle θs of one sample before from the current phase rotation angle θ to derive a phase difference dθ. The derived phase difference dθ is divided by the sampling time Ts to derive a differentiated phase rotation angle θ, that is, the instantaneous angular frequency (dθ/Ts). Subsequently, in the FM demodulator circuit 30, the instantaneous angular frequency (dθ/Ts) is subjected to bandwidth limitation to generate a demodulated signal S3 which is the result of demodulating the FM signal.

Stated another way, in the FM demodulator circuit 30, a current phase rotation angle θ is detected by the phase rotation angle detector circuit 31 based on an in-phase component I and a orthogonal component Q of an FM signal digitized by the sampling time Ts. Then, based on the calculated phase rotation angle θ, a phase rotation angle θs of one sampling time before is derived by a second phase rotation angle detector circuit (specifically, the D-FF 36). Then, in the FM demodulator circuit 30, a phase difference dθ is calculated between the current phase rotation angle θ and the phase rotation angle θs of one sampling time before, and the calculated phase difference dθ is multiplied by the inverse of the sampling time (1/Ts) to derive an instantaneous angular frequency (dθ/Ts). In this way, the demodulation is carried out.

As described above, since the FM demodulator circuit 30 demodulates FM signals without the necessity of a feedback loop, it can improve the demodulation characteristic in a phasing environment, as compared with the conventional FM demodulator circuit 12 employing a PLL configuration.

According to the configuration of the second embodiment as described above, since a phase difference dθ between a current phase rotation angle θ and a phase-rotation angle θs of one sample before is calculated based on an in-phase component I and an orthogonal component Q of an FM signal, and the phase difference dθ is differentiated to derive an instantaneous angular frequency (dθ/Ts), the FM signal can be demodulated without any feedback loop, thus making it possible to improve the demodulation characteristic in a simple configuration as compared with the prior art.

(3) Third Embodiment

Figure 4:
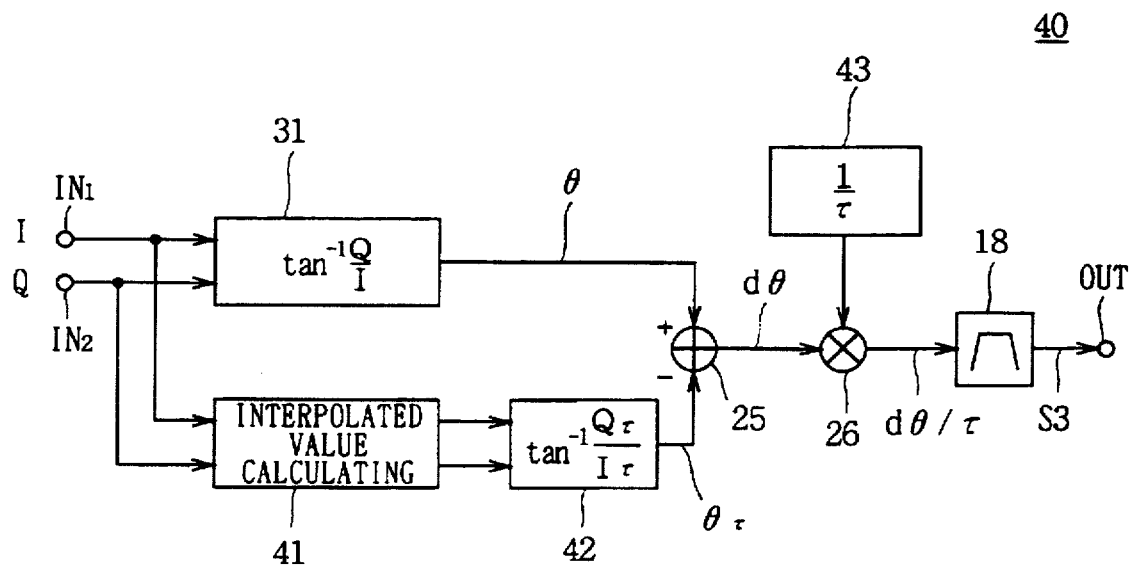
FIG. 4 is a block diagram illustrating the configuration of the FM demodulator circuit according to the third embodiment of the present invention.

Referring next to FIG. 4, in which parts corresponding to those in FIG. 3 are designated by the same reference numerals, an FM demodulator circuit according to a third embodiment is generally designated by reference numeral 40. An in-phase component I and an orthogonal component Q outputted from an orthogonal detector circuit 5 (see FIG. 1) located at a previous stage are supplied to a phase rotation angle detector circuit 31 and an interpolated value calculation circuit 41 through input terminals $IN_1$, $IN_2$, respectively.

The phase rotation angle detector circuit 31, which is similar to that of the second embodiment, divides the orthogonal component Q by the in-phase component I, and reads a phase rotation angle θ ($=\tan^{-1}$ (Q/I)) corresponding to the calculated quotient which is then outputted to a subtracter 25 at the subsequent stage.

The interpolated value calculation circuit 41 calculates an in-phase component Iτ and an orthogonal component Qτ of a time τ before by interpolation, and outputs the in-phase component Iτ and the orthogonal component Qτ of the time τ before to a phase rotation angle detector circuit 42. In this event, since the time τ is shorter than a sampling time Ts, the in-phase component Iτ and the orthogonal component Qτ of the time τ before represent in-phase component and orthogonal component at an arbitrary position between the current in-phase component I and orthogonal component Q and the in-phase component Is and the orthogonal component Qs of one sample before, respectively.

The phase rotation angle detector circuit 42, which is similar to the phase rotation angle detector circuit 31, divides the orthogonal component Qτ by the in-phase component Iτ, and reads a phase rotation angle θτ ($=\tan^{-1}$ (Qτ/Iτ)) corresponding to the calculated quotient which is then outputted to the subtracter 25 at the subsequent stage. In other words, the phase rotation angle detector circuit 42 derives a phase rotation angle θτ of the time τ before, based on the in-phase component Iτ and the orthogonal component Qτ of the time τ before.

The subtracter 25 subtracts the phase rotation angle θτ of the time τ before from the current phase rotation angle θ and outputs the resulting phase difference dθ (=θ−θτ) to a multiplier 26.

A storage element 43, composed for example of a memory, stores an inverse of the time τ (1/τ). This inverse of the time τ (1/τ) is read from the storage element 43 and supplied to the multiplier 26.

The multiplier 26 multiplies the phase difference dθ by the inverse of the time τ (1/τ) and outputs the multiplication result (dθ/τ) to a band-pass filter 18. In other words, a division of the phase difference dθ by the time τ is made by the multiplier 26 to differentiate the phase rotation angle θ, that is, to derive an instantaneous angular frequency.

Subsequently, the band-pass filter 18 limits the bandwidth of the multiplication result (dθ/τ) to generate a demodulated signal S3, which is the result of demodulating the FM signal, at an output terminal OUT.

Now, the principle of the FM demodulator circuit 40 configured as described above and the interpolated value calculation circuit 41 will be explained more specifically.

When the instantaneous angular frequency is calculated by dividing the phase difference dθ between the current phase rotation angle θ and the phase rotation angle θs of one sample before by the sampling time Ts, as is the case of the second embodiment, if the sampling time Ts is longer, the accuracy of the instantaneous angular frequency is deteriorated, which may cause the demodulation characteristic to be deteriorated.

To solve this problem, the third embodiment estimates a phase rotation angle θi at an arbitrary point between adjacent samples by interpolation and calculates the instantaneous angular frequency apparently with a shorter sampling time Ts. This operation will be described below using associated equations.

Assuming that a discrete phase value calculated from a received FM signal is θ [nTs], an estimated phase θ(t) at time t can be derived from a relationship given by the following equation:

$$\theta(t) = \sum_{n=-\infty}^{\infty} \theta[nTs]\{\sin\{2\pi f(t-nTs)\}/2\pi f(t-nTs)\} \quad (15)$$

Assuming herein that a sampling frequency fs is double a maximum modulation frequency f, Equation (15) is transformed as given by the following equation:

$$\theta(t) = \sum_{n=-\infty}^{\infty} \theta[nTs]\{\sin\{\pi(t/Ts-n)\}/\pi(t/Ts-n)\} \quad (16)$$

$$= \sum_{n=-\infty}^{\infty} \theta[nTs]\text{Sinc}(t/Ts-n)$$

where, $\text{Sinc}(t) = \sin\pi(t)/\pi(t)$

Thus, θ(t) in t=kTs−τ is given by the following equation:

$$\theta(kTs-\tau) = \sum_{n=-\infty}^{\infty} \theta[nTs]\text{Sinc}\{(k-n)-\tau/Ts\} \quad (17)$$

In this Equation (17), if k−n is substituted by N, Equation (17) is transformed into the following equation:

$$\theta(kTs-\tau) = \sum_{N=\infty}^{-\infty} \theta[k-N]\text{Sinc}\{N-\tau/Ts\} \quad (18)$$

Assuming further that a Sinc function in Equation (18) has a negligible magnitude in a range |M/2|>N, θ(t) in t=kTs−τ is given by the following equation:

$$\theta(kTs-\tau) = \sum_{N=M/2}^{-M/2} \theta[(k-N)Ts]\text{Sinc}\{N-\tau/Ts\} \quad (19)$$

Thus, a phase value at time kTs to a phase value of a time τ before can be estimated by using discrete phases calculated from an FM signal from time (k−M/s)Ts to time (k+M/2)Ts.

Therefore, the instantaneous angular frequency at time kTs is given by the following equation:

$$d\theta/dt = \{\theta[kTs] - \theta[kTs-\tau]\}/\tau \quad (20)$$

Demodulated waves can be generated by sequentially calculating the instantaneous angular frequency at each time using Equation (20).

Figure 5:
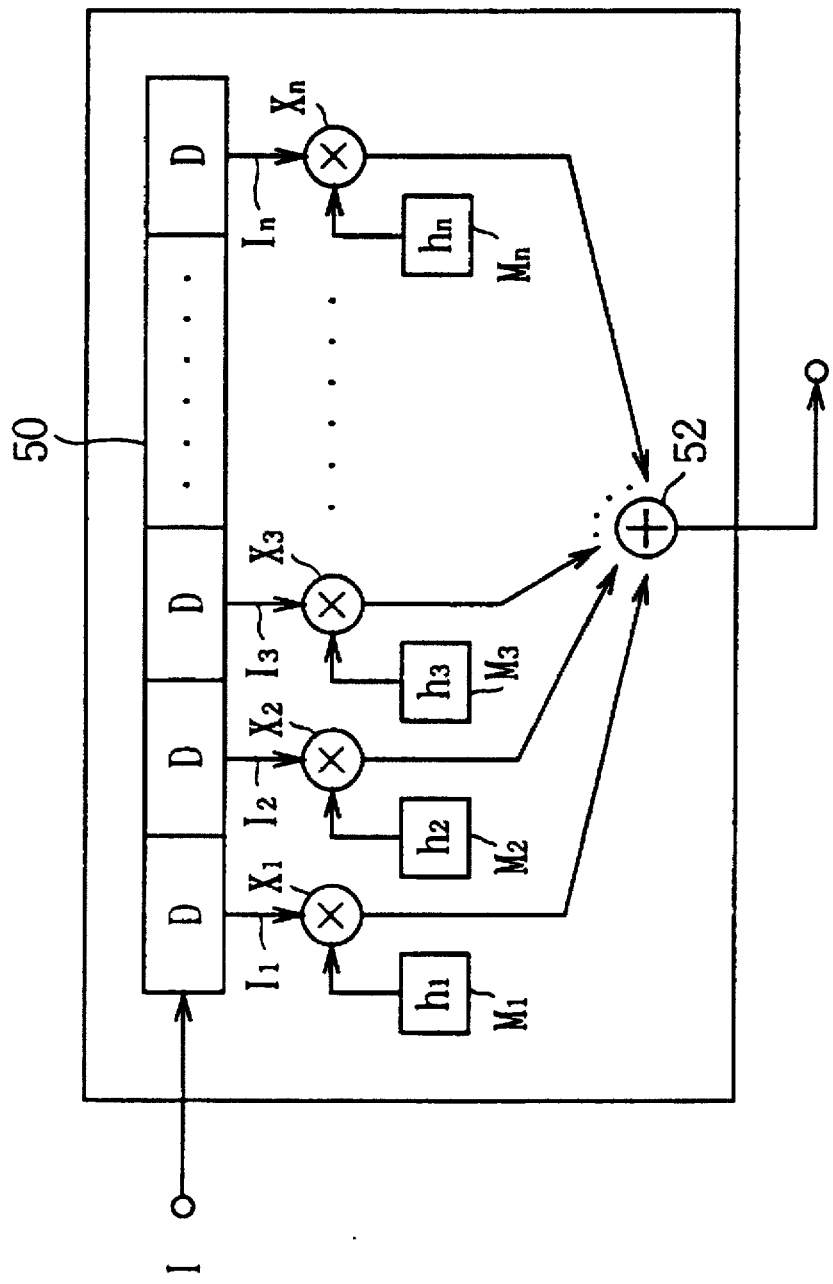
FIG. 5 is a block diagram illustrating the configuration of an interpolated value calculation circuit arranged in the FM demodulator circuit of the third embodiment.

Next, FIG. 5 illustrates the configuration of the interpolated value calculation circuit 41. While the interpolated value calculation circuit 41 calculates interpolated values for both of an in-phase component and an orthogonal component supplied thereto, the same circuit configuration is utilized for the calculation, so that explanation will be given only on the interpolation of the in-phase component I.

An in-phase component I supplied to the interpolated value calculation circuit 41 is first inputted to a shift register 50 of a series-input/parallel-output type composed of N D-FF's, and sequentially delayed by one sampling time Ts each time it is shifted from one D-FF to the next. In-phase components $I_1-I_n$ outputted from the respective D-FF's of the shift register 50 are supplied to multipliers $X_1-X_n$. The multipliers $X_1-X_n$ are also supplied with weighting values $h_1-h_n$ of the Sinc function stored in storage elements (for example, composed of memories) $M_1-M_n$, respectively. The multipliers $X_1-X_n$ multiply the in-phase components $I_1-I_n$ respectively supplied thereto by the corresponding weighting values $h_1-h_n$ and output the respective multiplication results to an adder 52. Then, the adder 52 adds the multiplication results of the respective multipliers $X_1-X_n$ to derive an in-phase component Iτ of a time τ before.

In this way, the interpolated value calculation circuit 41 calculates the above Equation (19) to derive the in-phase component Iτ of the time τ before. It will be understood that the interpolated value calculation circuit 41 uses the same circuit configuration as the above for an orthogonal component Q to derive an orthogonal component Qτ of the time τ before.

In the FM demodulator circuit 40 configured as described above, an in-phase component I and an orthogonal component Q of an FM signal supplied from the orthogonal detector circuit 5 are inputted to the phase rotation angle detector circuit 31 which divides the orthogonal component Q by the in-phase component I and reads $\tan^{-1}$ (Q/I) corresponding to the calculated quotient to derive a phase rotation angle θ.

Also in the FM demodulator circuit 40, the in-phase component I and the orthogonal component Q are respectively supplied to the interpolated value calculation circuit 41 which calculates interpolated values based on the in-phase component I and the orthogonal component Q to derive an in-phase component Iτ and an orthogonal component Qτ of a time τ before. Then, based on the in-phase component Iτ and the orthogonal component Qτ of the time τ before, the phase rotation angle detector circuit 42 derives a phase rotation angle θτ of the time τ before.

Next, in the FM demodulator circuit 40, a phase difference dθ between the current phase rotation angle θ and the phase rotation angle θτ of the time τ before is multiplied by the inverse of the time τ (1/τ) to derive a differentiated phase rotation angle θ, that is, an instantaneous angular frequency (dθ/τ). Subsequently, the derived instantaneous angular frequency (dθ/τ) is subjected to bandwidth limitation to generate a demodulated signal S3 which is the result of demodulating the FM signal.

Stated another way, in the FM demodulator circuit 40, the phase rotation angle detector circuit 31 detects a current phase rotation angle θ based on an in-phase component I and an orthogonal component Q. Also, in the FM demodulator circuit 40, the second phase rotation angle detector circuit (specifically, composed of the interpolated value calculation circuit 41 and the phase rotation angle detector circuit 42) calculates interpolated values based on the in-phase component I and the orthogonal component Q to derive an in-phase component Iτ and an orthogonal component Qτ of a time τ before, and derives a phase rotation angle θτ of the time τ before based on the derived in-phase component Iτ and orthogonal component Qτ of the time τ before. Then, a phase difference between the current phase rotation angle τ and the phase rotation angle θτ of the time τ before is multiplied by the inverse of the time τ (1/τ) to derive an instantaneous angular frequency (dθ/τ), thus carrying out the demodulation.

In this way, since the FM demodulator circuit 40 demodulates FM signals without the necessity of a feedback loop, it can improve the demodulation characteristic in a phasing environment, as compared with the conventional FM demodulator circuit 12 employing a PLL configuration.

In addition, in the third embodiment, since a phase rotation angle θτ of the time τ before, which is positioned between a current phase rotation angle θ and a phase rotation angle θs of one sample before, is calculated by interpolation to derive an instantaneous angular frequency, a deterioration in accuracy of the instantaneous angular frequency can be avoided to achieve favorable demodulation even if the sampling time Ts is long.

(4) Fourth Embodiment

Figure 6:
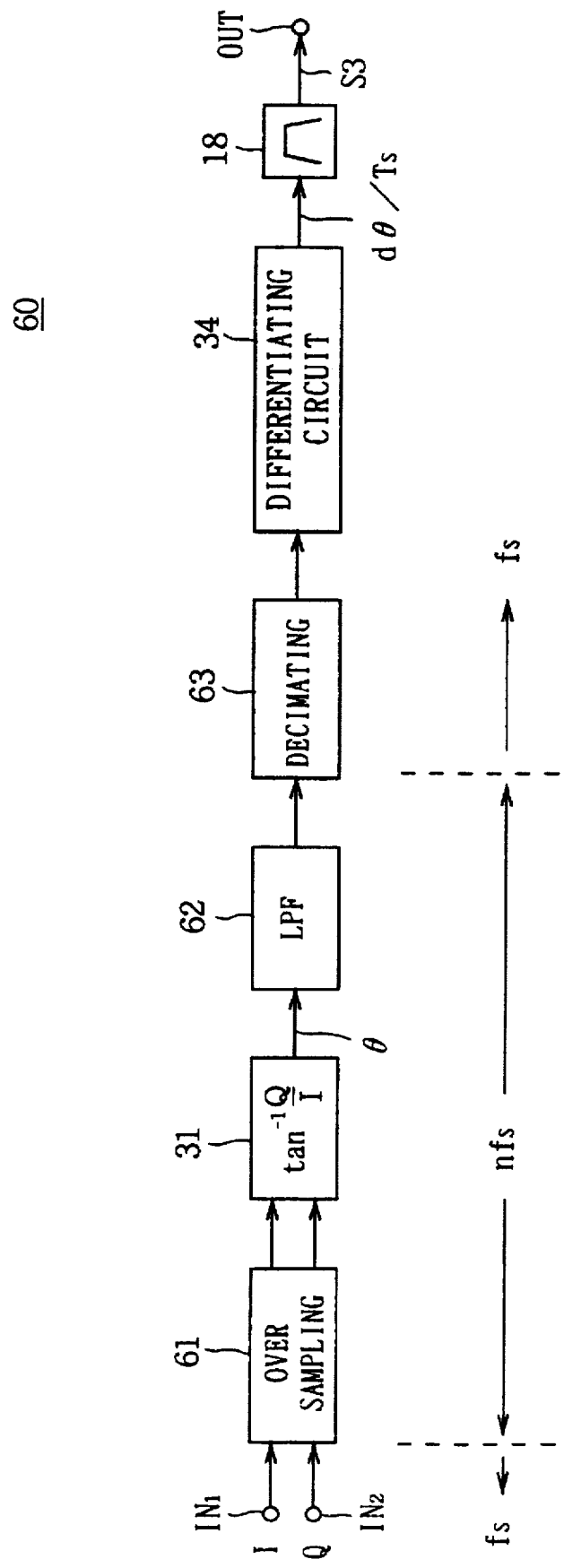
FIG. 6 is a block diagram illustrating the configuration of the FM demodulator circuit according to the fourth embodiment of the present invention.

Referring next to FIG. 6, in which parts corresponding to those in FIG. 3 are designated by the same reference numerals, an FM demodulator circuit according to a fourth embodiment is generally designated by reference numeral 60. The fourth embodiment is a modified version of the FM demodulator circuit 30 of the second embodiment illustrated in FIG. 3 so as to perform over-sampling.

Specifically, in the FM demodulator circuit 60, an in-phase component I and an orthogonal component Q of an FM signal outputted from an orthogonal detector circuit 5 (see FIG. 1) located at a previous stage are first supplied to an over-sampling circuit 61 through input terminals $IN_1$, $IN_2$, respectively. In this event, it is assumed that the in-phase component I and the orthogonal component Q have been sampled at a sampling frequency fs to be digitized in the orthogonal detector circuit 5.

The over-sampling circuit 61 performs n-fold over-sampling on the in-phase component I and the orthogonal component Q supplied thereto and outputs the resulting in-phase component I and orthogonal component Q at a sampling frequency of nfs to a phase rotation angle detector circuit 31. In this event, the over-sampling circuit 61 inserts (n−1) of "0"s between data to perform the n-fold over-sampling.

The phase rotation angle detector circuit 31, which is similar to that described in connection with the second embodiment, divides the orthogonal component Q by the in-phase component I and reads a phase rotation angle θ (=$\tan^{-1}$ (Q/I)) corresponding to the calculated quotient which is outputted to a low-pass filter (LPF) 62 at the subsequent stage.

The low-pass filter 62 removes unnecessary high frequency components included in the phase rotation angle θ outputted from the phase rotation angle detector circuit 31 and outputs the phase rotation angle θ free from such unnecessary high frequency components to a decimator circuit 63.

The decimator circuit 63 restores an original signal from an n-fold over-sampled signal, and specifically extracts only data portions from the phase rotation angle θ to restore the phase rotation angle θ at the original sampling frequency fs which is outputted to a differentiation circuit 34.

The differentiation circuit 34, which is similar to that described in connection with the second embodiment, derives a phase difference dθ between a phase rotation angle θs of one sample before generated by delaying the supplied phase rotation angle θ and a current phase rotation angle θ, and divides the phase difference dθ by a sampling time Ts to derive an instantaneous angle frequency dθ/Ts. Then, the differentiation circuit 34 outputs the derived instantaneous angular frequency dθ/Ts to a band-pass filter 18.

Subsequently, the band-pass filter 18 limits the bandwidth of the instantaneous angular frequency dθ/Ts to generate a demodulated signal S3, which is the result of demodulating the FM signal, at an output terminal OUT.

Here, the principle of the FM demodulator circuit 60 configured as described above will be explained specifically. When a circuit having a non-linear characteristic as expressed by "tan$^{-1}$", for example is used as a circuit for detecting a phase rotation angle θ, as is the case of the second embodiment, unnecessary high frequency components may be generated by the non-linear circuit to cause a deteriorated demodulation characteristic.

Figure 7A:
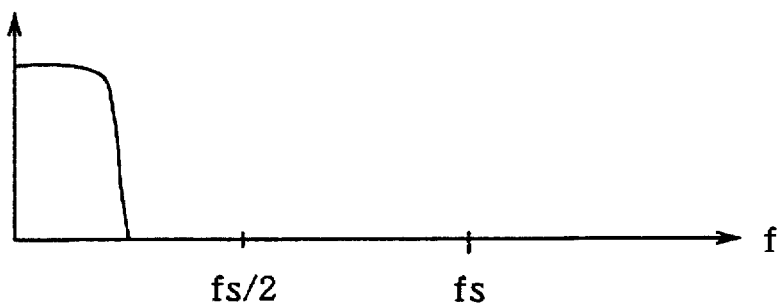
FIGS. 7A to 7D are graphs showing spectral distributions, explaining the principle of the FM demodulator circuit of the the fourth embodiment.
Figure 7B:
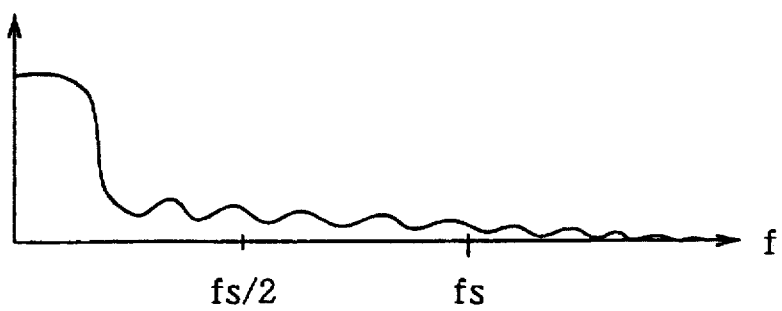

This phenomenon will be explained with reference to FIGS. 7A to 7D. If no non-linear circuit is used, the spectral distribution is as shown in FIG. 7A. In this case, with a sampling frequency set at fs, signal components having frequencies up to half that frequency fs/2, can be represented (according to the sampling theory). The spectral distribution is determined by the characteristic of a bandwidth limit filter used for bandwidth limitation on the transmission side, so that no high frequency components exist in principle.

Figure 7C:
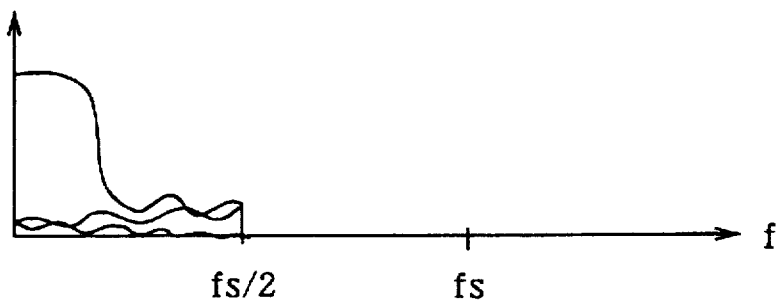
Figure 7D:
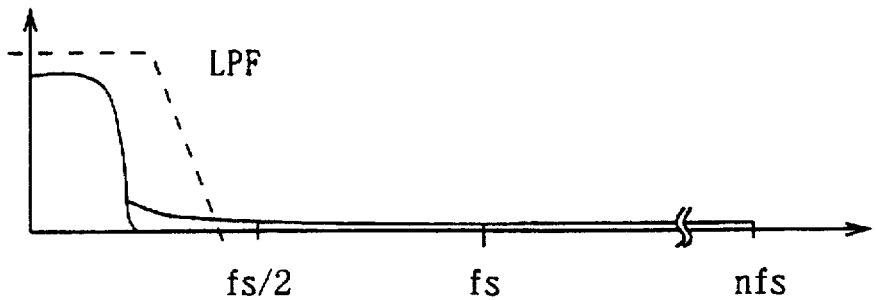

However, if a non-linear circuit is used, high frequency components are generated thereby in addition to actual signal components. The high frequency components are folded over a frequency band below fs/2, as shown in FIG. 7C, to affect the actual signal components as noise (so-called aliasing noise), thereby resulting in deteriorating the demodulation characteristic.

To solve this problem, the FM demodulator circuit 60 of the fourth embodiment performs the over-sampling to bring unnecessary high frequency components to an upper side of a frequency band, limits the bandwidth by the low-pass filter 62 to remove the unnecessary high frequency components, and then performs decimation to restore the original phase rotation angle.

Specifically, in the FM demodulator 60 of the fourth embodiment, the over-sampling circuit 61 over-samples an in-phase component I and an orthogonal component Q to convert their sampling frequency from fs to nfs. In this event, since signal components having frequencies up to nfs/2 are represented, unnecessary high frequency components other than actual signal components are removed by the low-pass filter 62. Subsequently, in the FM demodulator circuit 60, the decimator circuit 63 returns the sampling frequency from nfs to fs. Since the high frequency components have been removed by the low-pass filter 62, aliasing noise as mentioned above, is reduced.

As described above, the FM demodulator circuit 60 performs over-sampling on an in-phase component I and an orthogonal component Q supplied thereto to bring unnecessary high frequency components possibly generated by a non-linear circuit (specifically, the phase rotation angle detector circuit 31) to an upper side of a frequency band, and removes such unnecessary high frequency components by the low-pass filter 62. Subsequently, in the FM demodulator circuit 60, the decimator circuit 63 restores the over-sampled signal indicative of a phase rotation angle to the original signal indicative of the phase rotation angle. In this way, the FM demodulator circuit 60 can reduce aliasing noise which would otherwise be caused by unnecessary high frequency components, and accordingly provide a significant improvement in the demodulation characteristic.

Incidentally, while the analog-to-digital convertors 10, 11 in the orthogonal detector circuit 5 may be utilized to perform the over-sampling, the over-sampling circuit 61 is provided as described above since the over-sampling implemented by inserting "0"s in data facilitates subsequent calculations associated therewith.

According to the fourth embodiment configured as described above, since the FM demodulator circuit 60 is provided with the over-sampling circuit 61 for performing over-sampling on an in-phase component I and an orthogonal component Q, the low-pass filter 62 for removing unnecessary high frequency components possibly generated by a non-linear circuit, and the decimator circuit 63 for restoring an over-sampled signal to an original signal, aliasing noise caused by the unnecessary high frequency components can be reduced, thus making it possible to significantly improve the demodulation characteristic.

(5) Other Embodiments

While the fourth embodiment has been described in connection with the improvement of the demodulation characteristic achieved by the over-sampling which is applied to the FM demodulator circuit 30 of the second embodiment, the present invention is not limited to the application of the over-sampling to the second embodiment. The over-sampling may be likewise applied to the FM demodulator circuit 20 of the first embodiment and the FM demodulator circuit 40 of the third embodiment to remove unnecessary high frequency components, and the demodulation characteristic of the FM demodulator circuits 20, 40 can also be improved similarly to that of the FM demodulator circuit 60.

The essential point is that if the FM demodulator circuits 20, 30 or 40 can be provided with an unnecessary component removing circuit (61, 62, 63) for performing over-sampling to bring unnecessary high frequency components to an upper side of a frequency band, removing the unnecessary high frequency components by a predetermined low-pass filter, and then restoring an over-sampled signal to an original signal, the demodulation characteristic can be improved as is the case of the fourth embodiment.

Also, while the foregoing embodiments have been described for the case where the circuit subsequent to the orthogonal detector circuit 5 is an FM demodulator circuit (20, 30, 40, 60), the present invention is not limited to this particular configuration, and the entire circuit including the orthogonal detector circuit 5 may be regarded as an FM demodulator circuit.

Further, while the foregoing embodiments have been described such that the effects as mentioned above are produced as the FM demodulator circuits, the present invention is not limited to the FM demodulator circuits, and similar effects can also be produced when the present invention is applied to any communications terminal apparatus using an FM demodulator circuit as described above.

An example of the configuration of a communication terminal equipment will be described hereinafter.

Figure 8:
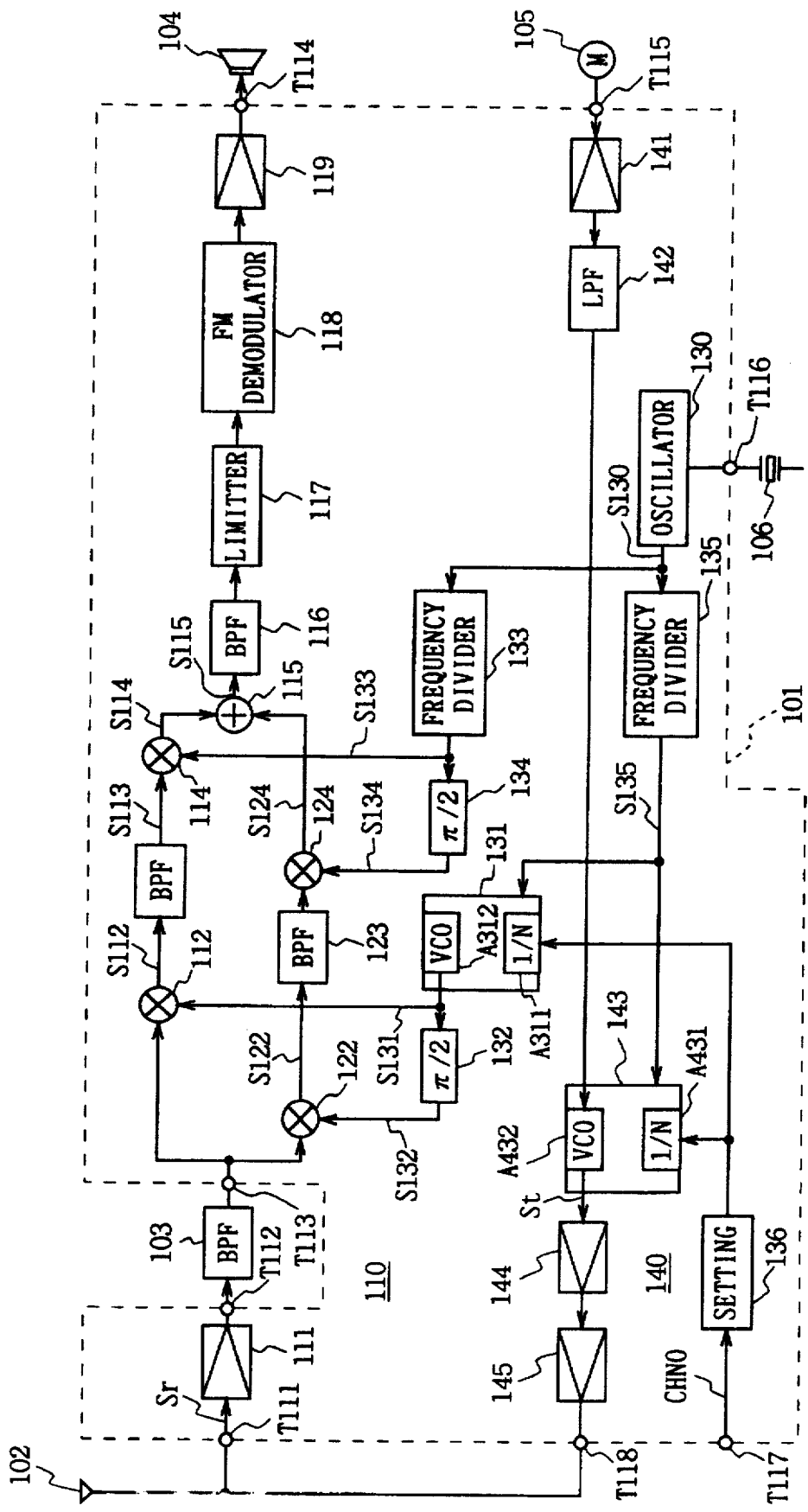
FIG. 8 is a block diagram showing an example of the configuration of communication terminal equipment using the FM demodulator circuit of the embodiments of the present invention.

It will be described about an example of receiving circuit and transmitting circuit of a communication terminal equipment, for example, which is a cordless telephone, accompanying with FIG. 8.

An integrated circuit (IC) 101 used in a cordless telephone comprises a receiving circuit 110 and a transmitting circuit 140. The receiving circuit 110 is structured in a double superheterodyne system. More specifically, an FM signal Sr of the incoming channel from the master telephone is received by an antenna 102 and supplied through the signal line, of a terminal T111, a high-frequency amplifier 111, a terminal T112, a band-pass pass filter 103 in which all of the incoming channels are passed, and a terminal T113, to the first mixer for I axis 112 and the first mixer for Q axis 122.

Also an oscillator 130 is provided to generate an oscillating signal S130 having a stable reference frequency, for example, of 14.4 MHz. Therefore, a crystal 106 is connected via a terminal T116 to the oscillator 130 to form a crystal oscillator circuit.

The oscillating signal S130 is supplied to a frequency divider circuit 135 to be frequency-divided into a signal S135 having a factor, for example, of 1/1152. The signal S135 having the frequency of 12.5 KHz in channel separation is supplied to a PLL circuit 131 as a reference frequency signal.

A frequency dividing ratio setting circuit 136 is provided in which when data of channel number CHNO is supplied through a terminal T117, frequency dividing ratio data is generated from the data of channel number CHNO.

Then, frequency dividing ratio data corresponding to the channel number CHNO from the setting circuit 136 is supplied and set to a variable frequency divider circuit A311 of the PLL circuit 131. In this manner, an oscillating signal S131 is output from a VCO circuit A312 of the PLL circuit 131.

The signal S131 is supplied to a mixer 112 as the first local oscillating signal and also supplied to a phase shifting circuit 132 to be shifted in phase by $\pi/2$, and thus obtained phase shifting signal S132 is supplied to a mixer 122 as the first local oscillating signal.

Similarly generated signals S133 and S134 are supplied to mixers 114 and 124, respectively.

The signals S114 and S124 are supplied to an adder circuit 115 to obtain an added signal S115.

The added signal S115 being the second intermediate frequency signal is supplied through a band-pass filter 116 and a limiting amplifier 117, which are an intermediate frequency filter, to an FM demodulator circuit 118 to be demodulated to an original aural signal. The aural signal is supplied through an amplifier 119 and a terminal T114 to a speaker 104 for telephone receiver.

The above is the configuration and the operation of the receiver circuit 110.

On the other hand, in the transmitter circuit 140, the aural signal is directly transmitted as an FM signal of the outgoing channel, and a PLL circuit 143, to which the frequency divided signal S135 from the frequency divider circuit 135 is supplied as a reference frequency signal, is provided therein. Further, in the transmitter circuit 140, frequency dividing ratio data corresponding to the channel number CHNO is supplied to set a variable frequency divider circuit A431 of a PLL circuit 143.

In this manner, a signal St having a carrier frequency fHS of the outgoing channel which corresponds to the incoming channel received by the receiver circuit 110 is obtained from a VCO circuit A432 of the PLL circuit 143.

An aural signal from a microphone 105 for telephone transmitter is supplied through a terminal T115 and an amplifier 141 to a low-pass filter 142 to remove any unnecessary frequency component, thereafter, it is supplied to the VCO circuit A432 of the PLL circuit 143 as the control signal of the oscillation frequency.

Thereby, the FM signal St, which is the outgoing channel corresponding to the incoming channel received by the receiver circuit 110 and is FM modulated by the aural signal from the low-pass filter 142, is obtained from the VCO circuit A432.

The FM signal St is output through a driving amplifier 144 and an output amplifier 145 to a terminal T118 to be supplied to an antenna 102.

The above is the configuration and the operation of the transmitter circuit 140.

As described above, according to the present invention, an in-phase component and an orthogonal component of a frequency modulated signal outputted from an orthogonal detector circuit are respectively delayed by one sampling time, the result of multiplying the in-phase component by a delayed orthogonal component is subtracted from the result of multiplying the orthogonal component by the delayed in-phase component, and the subtraction result is multiplied by an inverse of the sampling time to derive an instantaneous angular frequency, whereby the frequency modulated signal can be demodulated without any feedback loop which is required by conventional FM demodulator circuits, thus making it possible to avoid a deteriorated demodulation characteristic due to the influence of phasing or the like.

Also, a phase rotation angle is detected by a first phase rotation angle detector circuit based on an in-phase component and an orthogonal component of a frequency modulated signal outputted from an orthogonal detector circuit, a phase rotation angle of a predetermined time before is detected by a second phase rotation angle detector circuit based on the in-phase component and the orthogonal component outputted from the orthogonal detector circuit or based on the phase rotation angle detected by the first phase rotation angle detector circuit, a phase difference is detected between the phase rotation angle detected by the first phase rotation angle detector circuit and the phase rotation angle of the predetermined time before detected by the second phase rotation angle detector circuit, and the phase difference is multiplied by an inverse of the predetermined time to derive an instantaneous angular frequency, whereby the frequency modulated signal can be demodulated without any feedback loop which is required by conventional FM demodulator circuits, thus making it possible to avoid a deteriorated demodulation characteristic due to the influence of phasing or the like.

Further, an unnecessary component removing circuit is provided for bringing unnecessary high frequency components generated by a non-linear circuit to an upper side of a frequency band by over-sampling, removing the unnecessary high frequency components by a predetermined low-pass filter, and then restoring an over-sampled signal to an original signal, so that the demodulation characteristic can be prevented from being deteriorated by the unnecessary high frequency components.

It will be now understood that the present invention can realize a frequency modulated signal demodulator circuit in a simple configuration which is capable of improving the demodulation characteristic as compared with the prior art.

While the invention has been described in connection with the preferred embodiments of the invention, it will be obvious to those skilled in the art that various changes and modifications may be made. The appended claims all define the true spirit and scope of the invention.

What is claimed is:

1. A demodulator apparatus for demodulating a frequency modulated signal comprising:

orthogonal detection means for orthogonal-detecting said frequency modulated signal to generate a first digital output signal and a second digital output signal that have a predetermined difference therebetween;

first delay means for delaying said first digital output signal for a predetermined time;

second delay means for delaying said second digital output signal for said predetermined time;

first multiplying means for multiplying said first digital output signal by an output signal of said second delay means;

second multiplying means for multiplying said second digital output signal by an output signal of said first delay means;

subtracting means for subtracting an output signal of said first multiplying means from an output signal of said second multiplying means;

third multiplying means for multiplying an output signal of said subtracting means by a predetermined value; and filter means for filtering an output signal of said third multiplying means.

2. The demodulator apparatus according to claim 1, wherein:

said predetermined difference is orthogonal;

said predetermined time is one sampling period; and said predetermined value is a reciprocal number of one sampling period.

3. The demodulator apparatus according to claim 1, further comprising:

over-sampling means for over-sampling an output of said orthogonal detection means; and restoring means for decimating an output of said filter means to restore a data volume of said frequency modulated signal.

4. A demodulator apparatus for demodulating a frequency modulated signal comprising:

orthogonal detection means for orthogonal-detecting said frequency modulated signal to generate a first digital output signal and a second digital output signal having a predetermined difference therebetween;

first calculating means for calculating an angle of a phase of said first and second digital output signals;

second calculating means for calculating an angle of a phase of said first and second digital output signals at a predetermined time prior to a time when said phase angle is calculated by said first calculating means;

subtracting means for subtracting an output signal of said first calculating means from an output signal of said second calculating means;

multiplying means for multiplying an output signal of said subtracting means by a predetermined value;

filter means for filtering an output signal of said multiplying means;

over-sampling means for over-sampling an output of said orthogonal detection means; and restoring means for decimating an output signal of said filter means to restore a data volume of said frequency modulated signal.

5. The demodulator apparatus according to claim 4, wherein said second calculating means delays said output signal therefrom for said predetermined time.

6. The demodulator apparatus according to claim 5, wherein:

said predetermined difference is orthogonal;

said predetermined time is one sampling period; and said predetermined value is a reciprocal number of one sampling period.

7. A demodulator apparatus for demodulating a frequency modulated signal comprising:

orthogonal detection means for orthogonal-detecting said frequency modulated signal to generate a first digital output signal and a second digital output signal having a predetermined difference therebetween;

first calculating means for calculating an angle of a phase of said first and second digital output signals;

second calculating means for calculating an angle of a phase of said first and second digital output signals at a predetermined time prior to a time when said phase angle is calculated by said first calculating means;

subtracting means for subtracting an output signal of said first calculating means from an output signal of said second calculating means;

multiplying means for multiplying an output signal of said subtracting means by a predetermined value; and filter means of filtering an output signal of said multiplying means, wherein said second calculating means includes interpolated values calculating means for calculating interpolated values of said first and second digital output signals.

8. The demodulator apparatus according to claim 7, wherein said interpolated values represent values at a time less than one-sampling period prior to said time when said phase angle is calculated by said first calculating means.

9. The demodulator apparatus according to claim 7, wherein said interpolated values calculating means comprises:

a plurality of delaying means serially connected to each other for delaying said first and second digital output signals;

a plurality of multiplying means, each connected to an output terminal of each of said plurality of delaying means; and adding means for adding output signals of said plurality of multiplying means.

10. A demodulating method for demodulating a frequency modulated signal, comprising the steps of:

orthogonal-detecting the frequency modulated signal to generate a first digital output signal and a second digital output signal having a predetermined difference relative to each other;

delaying said first digital output signal for a predetermined time;

delaying said second digital output signal for said predetermined time;

first multiplying said first digital output signal by an output signal generated by said step of delaying said second output signal;

second multiplying said second digital output signal by an output signal generated by said step of delaying said first output signal;

subtracting an output signal generated by said first multiplying step from an output signal generated by said second multiplying step;

third multiplying an output signal generated by said subtracting step by a predetermined value; and filtering an output signal generated by said third multiplying step.

11. The demodulating method according to claim 10, wherein:

said predetermined difference is orthogonal;

said predetermined time is one sampling period; and said predetermined value is a reciprocal number of one sampling period.

12. The demodulating method according to claim 10, further comprising the steps of:

over-sampling said frequency modulated signal; and restoring said over-sampled signal.

13. A demodulating method for demodulating a frequency modulated signal, comprising the steps of:

orthogonal-detecting the frequency modulated signal to generate a first digital output signal and a second digital output signal having a predetermined difference from each other;

first calculating an angle of a phase of said first and second digital output signals;

second calculating an angle of a phase of said first and second digital output signals at a predetermined time prior to the time of said first calculating step;

subtracting an output signal generated by said first calculating step from an output signal generated by said second calculating step;

multiplying an output signal generated by said subtracting step by a predetermined value;

filtering an output signal generated by said multiplying step;

over-sampling an output of said orthogonal-detecting step; and decimating an output of said filtering step to produce a signal with a data volume equal to said frequency modulated signal.

14. The demodulating method according to claim 13, wherein said second calculating step delays said first and second digital output signals for said predetermined time.

15. The demodulating method according to claim 14, wherein:

said predetermined difference is orthogonal;

said predetermined time is one sampling period; and said predetermined value is a reciprocal number of one sampling period.

16. A demodulating method for demodulating a frequency modulated signal, comprising the steps of:

orthogonal-detecting the frequency modulated signal to generate a first digital output signal and a second digital output signal having a predetermined difference from each other;

first calculating an angle of a phase of said first and second digital output signals;

second calculating an angle of a phase of said first and second digital output signals at a predetermined time prior to the time of said first calculating step;

subtracting an output signal generated by said first calculating step from an output signal generated by said second calculating step;

multiplying an output signal generated by said subtracting step by a predetermined value; and filtering an output signal generated by said multiplying step, wherein said second calculating step includes the step of calculating interpolated values of said first and second digital output signals.

17. The demodulating method according to claim 16, wherein said interpolated values represent values at a time less than one-sampling period prior to said first calculating step.

18. The demodulating method according to claim 16, wherein said interpolated values calculating step comprises the steps of:

delaying said signals in a plurality of serial steps;

multiplying output signals generated by each of said plurality of delaying steps; and adding output signals generated by said plurality of multiplying steps.

19. A communicating apparatus for communication having transmitting means for transmitting an outgoing signal, and receiving means for receiving an incoming signal, said apparatus comprising:

radio frequency signal processing means for processing said incoming signal;

demodulating means for demodulating the signal processed by said radio frequency signal processing means; and audio frequency signal processing means for processing an output signal of said demodulation means, wherein said demodulation means includes:

orthogonal detection means to generate a first digital output signal and a second digital output signal having a predetermined difference relative to each other;

first delay means for delaying said first digital output signal for a predetermined time;

second delay means for delaying said second digital output signal for said predetermined time;

first multiplying means for multiplying said first digital output signal and an output signal of said second delay means;

second multiplying means for multiplying said second digital output signal by an output signal of said first delay means;

subtracting means for subtracting an output signal of said first multiplying means from an output signal of said second multiplying means;

third multiplying means for multiplying an output signal of said subtracting means by a predetermined value; and filter means for filtering an output signal of said third multiplying means.

20. A communicating apparatus for communicating including transmitting means for transmitting an outgoing signal, and receiving means for receiving an incoming signal, the apparatus comprising:

radio frequency signal processing means for processing said incoming signal;

demodulating means for demodulating the signal processed by said radio frequency signal processing means; and audio frequency signal processing means for processing an output signal of said demodulating means, wherein said demodulating means includes:

orthogonal detection means to generate a first digital output signal and a second digital output signal having a predetermined difference relative to each other;

first calculating means for calculating an angle of a phase of said first and second digital output signals, second calculating means for calculating an angle of a phase of said first and second digital output signals at a predetermined time prior to a time when said phase angle is calculated by said first calculating means;

subtracting means for subtracting an output signal of said first calculating means from an output signal of said second calculating means;

multiplying means for multiplying an output signal of said subtracting means by a predetermined value; and filter means for filtering an output signal of said multiplying means, wherein said second calculating means includes interpolated values calculating means for calculating interpolated values of said first and second digital output signals.

* * * * *